United States Patent
Nassuphis

[19]
[11] Patent Number: 6,033,721
[45] Date of Patent: *Mar. 7, 2000

[54] IMAGE-BASED THREE-AXIS POSITIONER FOR LASER DIRECT WRITE MICROCHEMICAL REACTION

[75] Inventor: Nikos Nassuphis, Athens, Greece

[73] Assignee: Revise, Inc., Burlington, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/329,192

[22] Filed: Oct. 26, 1994

[51] Int. Cl.[7] .............................. C23C 16/48; C23C 8/00; G01C 11/12; G01K 3/00

[52] U.S. Cl. ................................ 427/10; 427/8; 427/582; 427/586; 427/596; 356/2; 356/376; 356/381; 374/137

[58] Field of Search ........................ 156/345 MT, 345 LT; 118/715, 722, 725, 712; 427/586, 596, 597, 8, 9, 10, 582, 583, 584; 250/205, 559.22, 559.29; 356/376, 357, 2; 374/137, 9

[56] References Cited

U.S. PATENT DOCUMENTS

| | | | |
|---|---|---|---|
| 4,294,544 | 10/1981 | Atschuler et al. | 356/376 |
| 4,331,504 | 5/1982 | Chuang et al. | 156/635 |
| 4,340,617 | 7/1982 | Deutsch et al. | 427/53.1 |
| 4,426,584 | 1/1984 | Bohlen et al. | 250/492.2 |
| 4,500,789 | 2/1985 | Ban et al. | 250/492.2 |
| 4,615,756 | 10/1986 | Tsujii et al. | 156/345 |
| 4,615,904 | 10/1986 | Ehrlich et al. | 427/38 |
| 4,622,095 | 11/1986 | Grobman et al. | 156/635 |

(List continued on next page.)

OTHER PUBLICATIONS

Hanabusa et al. "Laser–Induced vapor deposition of silicon", *Appl. Phys. Lett.* vol. 35, pp 626–627, (Oct. 1979).

Ehrlich et al. "Laser Direct Writing for VLSI", *VLSI Electronics Microstructure*, vol. 7, pp. 129–152 (1983) no month.

Feder, "Making a Model and Doing It Fast", *The New York Times*, Sunday, Sep. 23, 1990, p. F9.

Davis et al. "A simple model of the chemically assisted ion beam etching yield of GaAs with $Cl_2$ at medium current densities", *J. Vac. Sci. Technol. B*, vol. 8, pp. 1798–1803 (Nov./Dec. 1990).

Dobisz et al. "Lithography with a 50KV e beam and a vacuum scanning tunneling microscope in a polydiacetylene negative resist", *J. Vac. Sci. Technol. B*, vol. 8, pp. 1754–1758 (Nov./Dec. 1990).

Gandhi et al., "Parametric modeling of focused ion beam induced etching", *J. Vac. Sci. Technol. B*, vol. 8, pp. 1814–1819 (Nov./Dec. 1990).

Jee et al. "Laser application in packaging of very large scale integrated chips", *J. Vac. Sci. Technol. B*, vol. 8, pp. 1789–1793 (Nov./Dec. 1990).

Liu et al. "The effect of resist contrast on linewidth error induced by e–beam proximity exposure", *J. Vac. Sci. Technol. B*, vol. pp. 1872–1913 (Nov./Dec. 1990).

(List continued on next page.)

*Primary Examiner*—Marianne Padgett
*Attorney, Agent, or Firm*—Lahive & Cockfield, LLP

[57] ABSTRACT

Apparatus for determining a best trajectory for laser CVD through a strategy of acquiring a series of two-dimensional plane images of the substrate. These images, taken together, contain topographical information as well as local reflectivity and thermal mapping information. The images are combined in digital format with additional substrate mapping information to calculate a best three-dimensional trajectory for the desired laser operation. The technique is especially suitable for compensation of tilt or severe height variation on microelectronic parts. The apparatus can deposit platinum conductors on integrated circuits by pyrolytic deposition from $Pt(PF_3)_4$ vapor.

10 Claims, 8 Drawing Sheets

U.S. PATENT DOCUMENTS

| | | | |
|---|---|---|---|
| 4,728,799 | 3/1988 | Gordon et al. | 250/492.2 |
| 4,748,045 | 5/1988 | Ehrlich et al. | 427/53.1 |
| 4,816,692 | 3/1989 | Rudert, Jr. | 250/492.22 |
| 4,817,020 | 3/1989 | Chande et al. | 374/9 |
| 4,834,834 | 5/1989 | Ehrlich et al. | 156/635 |
| 4,868,005 | 9/1989 | Ehrlich et al. | 427/53.1 |
| 4,895,780 | 1/1990 | Nissan-Cohen et al. | 430/5 |
| 4,929,402 | 5/1990 | Hull | 264/22 |
| 4,953,982 | 9/1990 | Ebbing et al. | 356/355 |
| 4,972,072 | 11/1990 | Hauser et al. | 356/357 |
| 4,986,664 | 1/1991 | Lovoi | 356/376 |
| 4,998,021 | 3/1991 | Mimasaka | 356/357 |
| 5,060,595 | 10/1991 | Ziv et al. | 118/722 |
| 5,081,002 | 1/1992 | Ruberto et al. | 430/297 |
| 5,086,398 | 2/1992 | Morizumi | 364/490 |
| 5,129,991 | 7/1992 | Gilton | 156/635 |
| 5,135,695 | 8/1992 | Marcus | 264/141 |
| 5,151,609 | 9/1992 | Nakagawa | 250/561 |
| 5,182,718 | 1/1993 | Harafuji et al. | 364/490 |
| 5,204,734 | 4/1993 | Cohen | 356/359 |
| 5,232,749 | 8/1993 | Gilton | 427/558 |
| 5,348,609 | 9/1994 | Russell et al. | 156/345 |
| 5,389,196 | 2/1995 | Bloomstein et al. | 156/643 |
| 5,457,534 | 10/1995 | Lacey et al. | 356/359 |
| 5,473,434 | 12/1995 | de Groot | 356/359 |
| 5,502,564 | 3/1996 | Ledger | 356/355 |
| 5,754,294 | 5/1998 | Jones et al. | 356/357 |

OTHER PUBLICATIONS

Mancini et al. "Synchrotron radiation induced chemical vapor deposition of thin films from metal hexacarbonyls", *J. Vac. Sci. Technol. B,* vol. 8, pp. 1804–1807 (Nov./Dec. 1990).

Marella et al. "Process margins for pulsed laser–induced via filling", *J. Vac. Sci. Technol. B,* vol. 8, pp. 1780–1785 (Nov./Dec. 1990).

Tao et al. "Focused beam induced deposition of platinum", *J. Vac. Sci. Technol. B,* vol. 8, pp. 1826–1829 (Nov./Dec. 1990).

Westberg et al. "Truly Three Dimensional Structures Microfabricated by Laser Chemical Processing", IEEE, 91CH2817, pp. 516–519 (May 1991).

Amato, "The Small Wonders of Microengineering", *Science,* vol. 253, pp. 387–388 (Jul. 1991).

Bloomstein et al. "Laser Deposition and Etching on Three–Dimensional Microstructures", Published in 1991 International Conf. on Solid–State Sensors and Actuators Digest of Technical Papers (Jun. 24–27, 1991), IEEE, 91CH2817, pp. 507–511 (May 1991).

Bloomstein et al., "Laser–Chemical Three–Dimensional Writing of Multimaterial Structures for Microelectromechanics", Published in Proceedings for IEEE Micro Electro Mechanical Systems, pp. 202–203 (1991). Jun. 24–27, 1991.

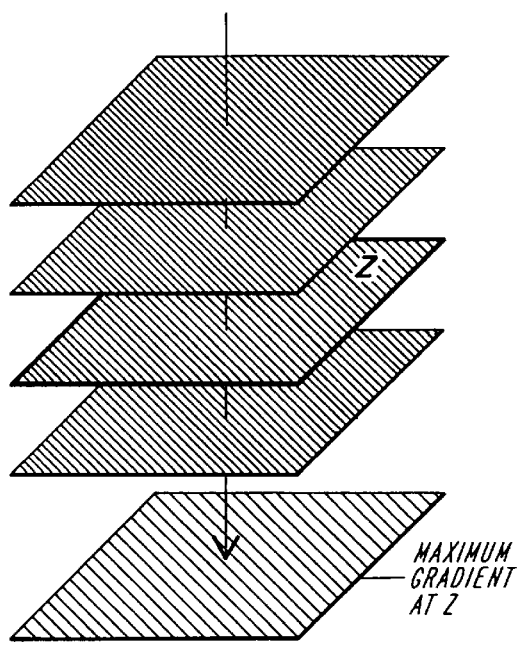
FIG. 5
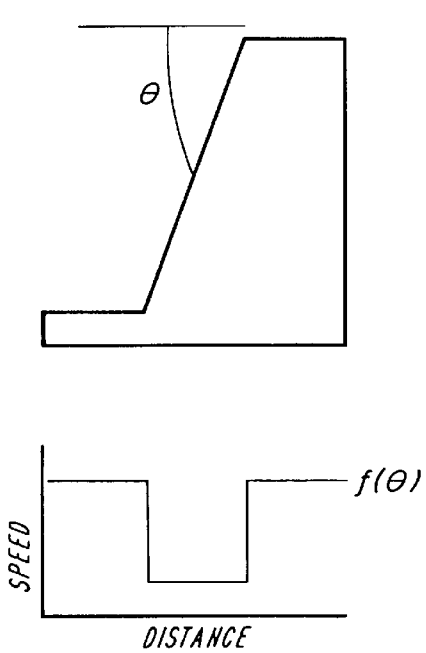
(A) RAMP-COMPENSATING VELOCITY MODULATION
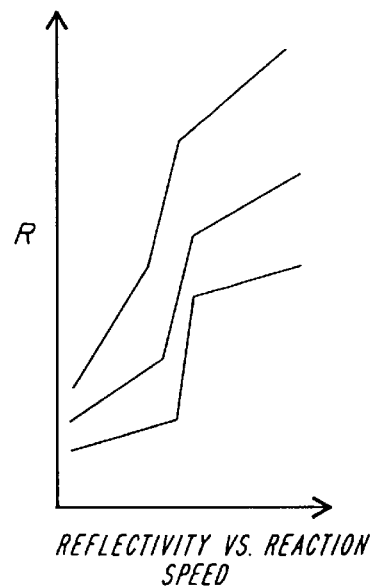
(B) REFLECTIVITY COMPENSATING POWER MODULATION
FIG. 6

IMAGE-BASED THREE-AXIS POSITIONER FOR LASER DIRECT WRITE MICROCHEMICAL REACTION

TECHNICAL FIELD

This invention relates to the field of laser microchemical reactions on substrates and more particularly to laser induced deposition of films on surfaces.

BACKGROUND ART

Laser chemical vapor deposition (CVD) is a method for locally depositing thin films onto surfaces without photo-masking the surfaces. The method entails focusing a laser beam, typically to micrometer dimensions, on a substrate in the presence of a chemically reactive ambient gas, liquid or a solid film. The laser induces a highly localized chemical reaction resulting in thin film deposition in the laser-treated zone.

The techniques of laser activated chemistry are diverse and can involve pyrolysis (e.g., thermal decomposition) or photolysis (linear photochemistry). In many cases the laser CVD reaction has a very strong nonlinear dependence on laser flux and may be difficult to control, although this same sensitivity to laser flux can be used to achieve greater spatial resolution on the substrate.

There are several ways to implement substrate patterning to achieve laser microchemical reactions. For example, in the laser direct writing geometry, the laser is scanned relative to the substrate to serially write lines. In laser projection patterning, an image field is projected onto the substrate much like a photographic printing method.

U.S. Pat. No. 4,340,617 to Deutsch et al. describes the laser direct writing geometry using photolytic processes in several organometallic precursor vapors. For example, photolysis of dimethyl cadmium or trimethyl aluminum is accomplished using a 257 nm (ultraviolet) frequency-doubled argon-ion laser. This approach was subsequently extended in U.S. Pat. No. 4,868,005 to the photolysis of chromyl chloride and cobalt carbonyl with visible laser light. Photolysis as described by Deutsch et al. is a "substantially linear" process with variation of laser flux.

The alternative approach of pyrolytic deposition, while retaining the laser direct writing geometry, is described by Hanabusa et al. (Appl. Phys. Lett. 35 (8) pp 626–627, October 1979). In this case the scanned focused beam is retained; however, the laser is used to induce a strong local temperature rise in the substrate. Deposition is by pyrolysis, i.e., by thermal decomposition of the organometallic precursor vapor. Pyrolysis is a thermally activated process characterized by a strongly nonlinear (exponential) dependence on temperature.

In the approach of Deutsch et al., the "substantially linear" behavior of the photochemical process allows relatively easy control of the process. That is, a 10% change in laser flux typically results in approximately a 10% change in film thickness. Furthermore, since the laser light is directly coupled into the precursor molecule itself, substrate properties are largely unimportant. In the pyrolytic approach of Hanabusa et al., however, all substrate variations, such as changes in reflectivity or local thermal conductivity, are important. In addition, the result of a small variation in laser power, for example, from a defocus of the lens or from a substrate reflectivity change, results in a much magnified variation in resulting deposition.

In practice, pyrolytic deposition processes have a relatively narrow region of operation in laser power. Writing at constant power across a substrate with variable reflectivity or thermal conductivity can be difficult or impossible since the fixed laser power will be subthreshold for one area while it is damaging elsewhere on the substrate. Furthermore, attaining uniform coverage over steps in substrate height is a critical problem since a constant-power, constant-velocity scan across an irregular topography leads to line thinning and, often, to an open circuit at the step.

In addition, a practical limitation for laser direct instrumentation is the need to meticulously maintain focus over substrates with height changes. At high line resolution the depth of focus for the lens is typically a few micrometers or less, while substrates (particularly in the new fields of microelectromechanics and advanced electronic packaging) may have topography changes of ten to one hundred micrometers or more.

Therefore a method and apparatus is needed to determine a three-dimensional, rather than just a two-dimensional, trajectory for the laser spot. It is highly desirable that this method be able to compensate for local slope changes, reflectivity changes and thermal conductivity changes in the substrate.

Furthermore, although there are no good preexisting solutions to the complex trajectory problem for laser direct write deposition, there is an analogous problem for scanning electron-beam lithography systems. For electron-beam exposure one must compensate for so-called "proximity effects" due to interaction between nearby areas of a lithographic pattern. Proximity effect correction algorithms are the subject of numerous patents and papers in the literature (see, for example, the proceedings of the 34th international symposium on electron, ion and photon beams, (J. Vac. Sci. Technol. B, 8, (1990) pp. 1321–2053).

Although the electron beam system provides a model for an approach to the "proximity effect" problem, the laser direct write deposition problem is distinctly different. There is no need to generate three-dimensional trajectories for electron beams since electron optics have very large or, for practical lithography applications, infinite depth of focus. Additionally, the laser direct write method requires independent control of actual beam intensity and actual scan speed and must consider substrate optical and material properties.

SUMMARY OF THE INVENTION

The present invention solves the laser CVD direct write problem through collection of two-dimensional images which include complex substrate topographical and materials properties. These images are then combined to create a power and scan rate-variable three-dimensional trajectory for the laser focus.

This invention provides a solution to the problem of defining a best trajectory for deposition of thin films on topographically complex substrates by the laser direct writing method. It addresses a unique problem in the field of laser direct write deposition wherein, unlike conventional thin film deposition, laser chemical vapor deposition (CVD) requires real-time local control. The requirements of laser CVD stem from a highly nonlinear dependence on laser power, scan velocity and exact point of focus, combined with the three-dimensional topography of the substrate, because height changes drastically change laser power through defocus. These requirements differentiate laser CVD from standard lithography. Laser CVD operates continuously during irradiation and therefore the exact trajectory, including three-dimensional position, scan velocity and laser power, must be continuously controlled and may require modification during scanning. Such real-time control is not needed for traditional laser processing such as laser memory repair, where it is only the beam settling point rather than the trajectory which is important. In memory repair the laser is only turned on when the positioning stage is stationary. Additionally, for laser deposition, optimum values for scan velocity and laser power depend on the local thermal and optical properties, which are in turn influenced by preexisting structure near the focus on the substrate.

According to one embodiment, the invention provides apparatus for direct laser writing in three dimensions. The apparatus comprises, inter alia, an element for positioning a substrate within a laser-reactive environment and an element for acquiring and storing multiple two-dimensional images of the substrate. The apparatus further comprises an element for integrating the acquired two-dimensional images of the substrate to obtain a three-dimensional representation of the substrate. An optimum laser trajectory is computed from the three-dimensional representation of the substrate. The apparatus further includes an element for producing a laser beam and for focusing the laser beam on the substrate to achieve a desired laser power intensity at the substrate surface. The movement and focus of the laser beam on the substrate are controlled according to the computed laser trajectory to achieve a topographically compensated laser-induced microchemical reaction on the substrate.

In one embodiment of the invention, the apparatus further includes an element for delivering at least one reactant into the laser-reactive environment.

In accordance with the invention apparatus is provided to determine and execute a complex three-dimensional trajectory during laser CVD. As support for the invention, the standard elements of a laser direct write deposition system are established. The substrate is contained in a suitable laser-reactive environment for deposition, e.g., a windowed vapor cell. Elements are provided to focus a laser beam, typically, to micrometer or submicrometer dimensions, at a point on the substrate, and to scan the laser spot across the substrate. Scanning can be achieved, for example, by movement of the substrate with precision X,Y,Z stages. Alternatively, the substrate can remain fixed and the laser beam with focusing optics can move. In a typical application of the invention the substrate will have substantial three-dimensional topography and/or thin film patterns disruptive to laser CVD on its surface. Additionally, the laser direct write system includes a, preferably color, digital imaging device such as a charge coupled device arranged so as to provide two-dimensional images of the substrate through the laser focusing optic itself.

In one embodiment, the full imaging system has the following four subsystems:

(i) Image Acquisition Subsystem. This is typically a two-dimensional solid-state imaging device such as a charge-coupled device (CCD) combined with single-frame intermediate storage electronics.

(ii) Image Processor Subsystem. This subsystem extracts critical data from the intermediate storage including local contrast and color data.

(iii) Path Generator Subsystem. This subsystem combines the two-dimensional images to determine substrate topography and also determines the laser geometrical trajectory in three dimensions. Additionally, it provides local biasing factors to specify the laser power and scan velocity to be applied over various segments of the path.

(iv) Motion Controller. This implements the specified laser trajectory at controlled velocity and laser power.

The image-based construction of the three-dimensional trajectory for laser scanning can be as follows:

(i) a series of planar video images are acquired at incremental depths by recording images as the focal position is successively stepped downward. These planar images contain information on the height variation and also, through color coding map the optical and material properties of the substrate. As used throughout this application, the term color coding includes broadly both color coding and also gray scale coding.

(ii) the topographical information is recorded as regions of best focus, typically by sharpest pixel-to-pixel contrast for line scans of the video image. Best focus is encoded by plane.

(iii) optical reflectance and colors are encoded to a weighting function which contains desired bias factors to set laser power and scan velocity. Biasing factors (for both laser power and scan velocity) also map to image features. For example, it is possible to produce extra laser dwell at substrate steps.

(iv) the desired "bird's eye" (vertical projection) two-dimensional path for the laser is then inserted by writing this path on one planar image.

(v) a computational operation is carried out using the acquired data to generate and execute the three-dimensional trajectory with synchronized laser power and scan velocity instructions.

The following algorithm can be used in steps (ii) through (v): First, a sequence of images at regular Z intervals is obtained and stored, along with their Z values. The stored images are then transformed by a gradient operator that has large values wherever the image has sharp intensity transitions. The height map and the intensity map are calculated. After these calculations have been performed, a height map is created which contains the Z-height at every X,Y point of the image, and an intensity map is created which contains the image intensity at every point, when the particular point is in focus. These maps are then used to modulate the laser power and scanning speed as an operation is performed. Making the focal point track the workpiece surface is typically the most effective compensation strategy. The focal point trajectory can be calculated using the height map obtained through the calculations outlined below. Because ramp-like variations in Z effectively increase the X,Y speed relative to the substrate, a speed compensation is possible. One goal is to keep the laser scan velocity tangent to the path constant.

The preceding description relates to the automated trajectory planning prior to activation of the laser. The invention also provides an image-based feedback mechanism for real-time control of laser direct write operations when the laser is on. For image-based feedback, the full imaging system (as described above) monitors changes in the substrate due to laser deposition. For example, laser deposition of metal causes a change in reflectivity and color and the nature of the change is strongly correlated to the film thickness. This data is added in a feed-forward manner to modify the trajectory instructions or to modify laser instructions relating, for example, to power and scan velocity. This image-based feedback allows the invention to be used when there is insufficient information in the images before the laser is turned on, or when there is insufficient reproducibility or control in the laser process.

An additional feature of the invention is the capability for real-time laser adjustment as a means to switch between laser direct-write processes by pulse width variation using a particular property of Q-switched lasers. We term the new form of laser control "regeneration switching." It is implemented using a repetitively Q-switched laser through simultaneous computer variation of pulsing rate and pumping rate.

The capability for regenerative switching stems from a particular property of lasers when operated in the repetitively Q-switched mode. To achieve the desired new control the laser is typically operated at repetition frequencies exceeding the laser cavity regeneration time. Therefore the stored power in the laser cavity does not have sufficient time between pulses to regenerate to its saturated value. This reduces the gain in the laser and causes the pulse length to stretch. Therefore by varying pulsing frequency it is possible to change pulse length. Variation by this means allows surface irradiation conditions to be separately optimized for laser switching or laser deposition without changing between laser types. A typical application is to stretch pulses greatly using this form of control for laser deposition. The cavity pumping rate would typically be increased as much as possible and the repetition rate would simultaneously be increased to a high number. To rapidly switch to a laser etching mode, short pulses are created on demand by rapidly changing to a low repetition rate and a low pump power. Although counterintuitive, this permits fast switching between laser process modes under computer control. It also provides a crucial means to implement laser pulse length variations on the fly and extends the range of laser microchemical processing available with a single laser configuration and single laser type.

The invention can also include the application of the image-based feedback in combination with a "learning" algorithm to establish the biasing factors for the Path Generator Subsystem. In this embodiment, the biasing factors used to map to image features are "learned" through trial and error on the substrate and these factors are then input into the Path Generator for subsequent calculation of trajectories.

The invention will next be described in connection with certain illustrated embodiments. However, it should be clear to those skilled in the art that various modifications, additions and subtractions can be made without departing from the spirit or scope of the claims.

BRIEF DESCRIPTION OF THE DRAWINGS

For a fuller understanding of the nature and objects of the invention, reference should be made to the following detailed description and the accompanying drawings, in which:

FIG. 5 shows the strategy for calculating a "height map" from the images gathered according to FIG. 3;

FIG. 6 shows ramp-compensating velocity (or, equivalently, speed) modulation and reflectivity-compensating power modulation;.

DETAILED DESCRIPTION

Figure 1:
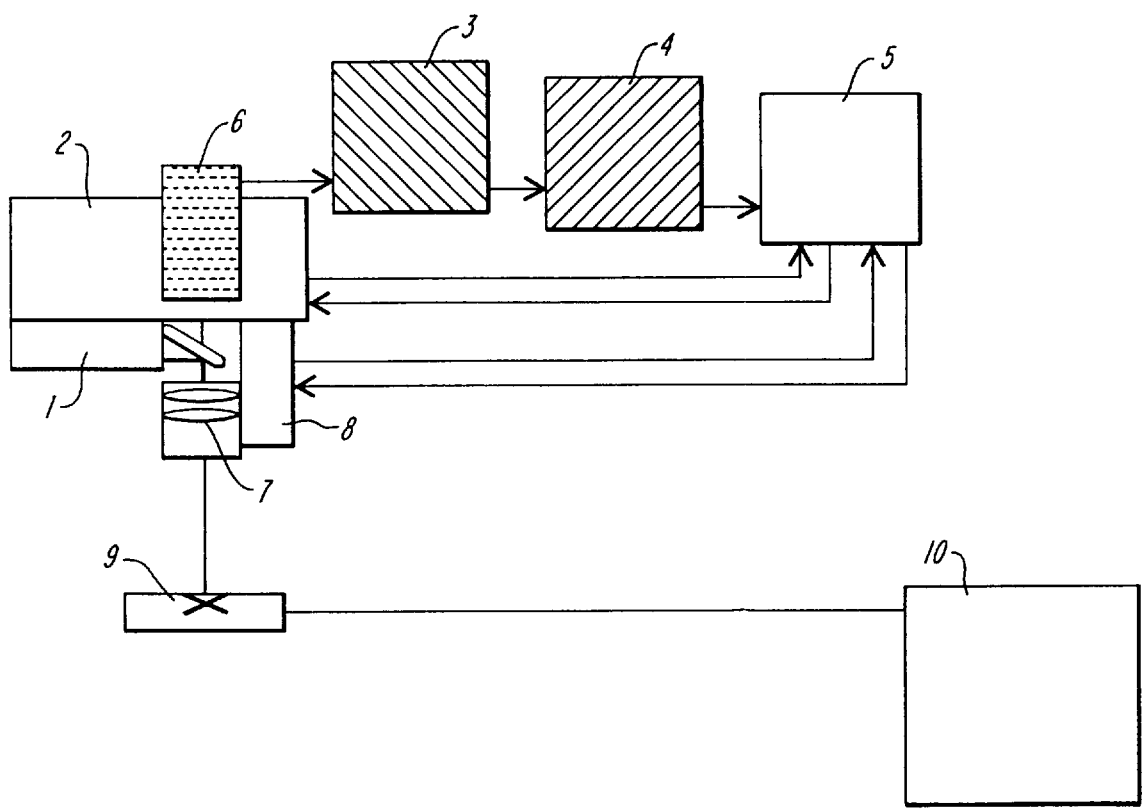
FIG. 1 is a schematic drawing of the laser direct write system with image-based three-axis positioner.

A system needed to apply the invention is similar to that previously described more generally for laser direct write deposition (see D. J. Ehrlich et al., "Laser Microchemistry for use in Solid State Electronics", IEEE J. Quantum Electronics QE-16 p. 1233, 1980). Such a system is indicated in FIG. 1 and includes a laser 1, an X,Y translation stage 2, a Z stage 8, an optical focusing/imaging system 7, a vacuum plumbing system 10, and a substrate fixture 9. The system of the present invention further includes image processor 3, path generator 4, motion controller 5 and image acquisition subsystem 6. Motion controller 5 receives information from the image acquisition subsystem 6 and the image processor 3 via the path generator 4 and provides feedback information to the X,Y translation stage 2 and to the Z stage 8 to position the laser according to the planned trajectory.

In FIG. 1 the laser optical system moves while the substrate remains stationary. This architecture permits the substrate to remain stationary during the laser processing steps. Important benefits are that the precision stages need not move massive parts of the vacuum plumbing system 10, and that in situ electronic testing of the substrate is greatly facilitated.

FIG. 1 also indicates the control system utilized in one embodiment of the invention. The subsystems are Image Acquisition Subsystem 6, an Image Processor 3, a Path Generator 4 and a Motion Controller 5. The Image Acquisition Subsystem 6 can be an electronic camera system such as, for example, a commercially available color charged-coupled device camera (Panasonic Corporation). A platinum silicide infrared detector or other imaging system can also be used. The Motion Controller Subsystem 5 can be a programmable multiaxis controller (such as, for example, a PMAC from Delta Tau Data Systems Inc.) suitable for simultaneous closed-loop servo positioning of the X,Y translation stage 2, the Z-stage 8 and the substrate fixture 9, described above. The Image Processor 3 and Path Generator 4 can be lodged inside a separate computer system (for example, an IBM 486 clone from Northgate Inc.).

Figure 2:
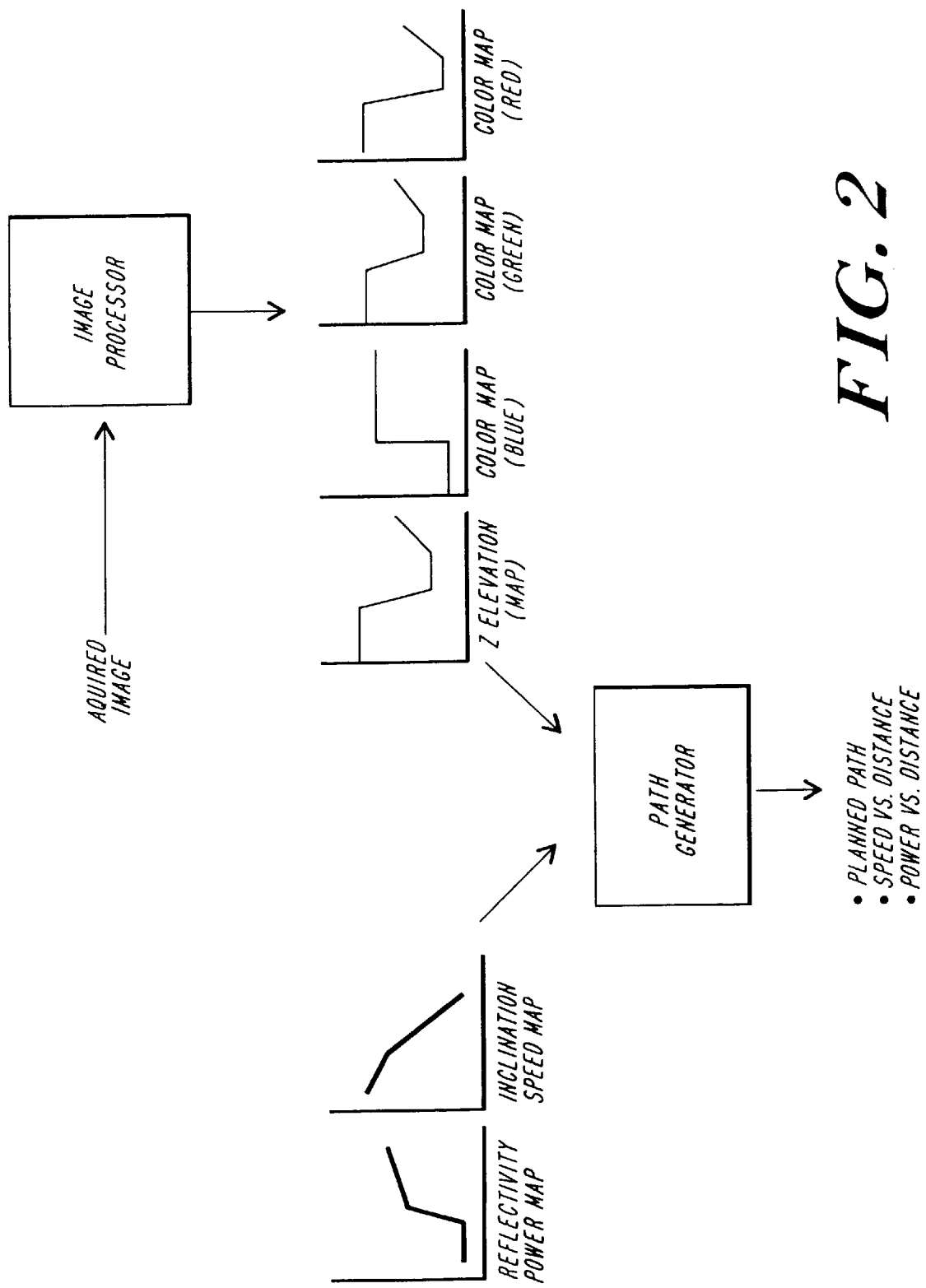
FIG. 2 shows the functional relationship between the Image Processor and the Path Generator subsystems.

FIG. 2 illustrates the full procedure for calculating three-dimensional path, scan-speed, and laser power settings as a function of distance. A series of two-dimensional images are acquired by the Image Acquisition subsystem. The Image Processor then decomposes these images and reconstructs their information into a Z-elevation map and three color coded maps representing images in three colors having wavelengths $\lambda_r$, $\lambda_g$, and $\lambda_b$, wherein those colors can be for example, red, green, and blue, respectively (together referred to as the "image based" maps). Together these maps describe the local substrate area which is to be laser processed. The output of the Image Processor includes the four "image based" maps, shown in FIG. 2. The Path Generator then combines the "image based" maps with a predetermined reflectivity power map and a predetermined inclination speed map, jointly referred to as "laser process" maps, also shown in FIG. 2. The reflectivity power map relates required laser power to substrate reflectivity or color, and the inclination speed map relates required writing speed to local tip angle of the substrate. The output of the Path Generator is the planned trajectory and the laser and scan speed process settings.

The following algorithm can be used to obtain the intensity and topography map of the working area:

First a sequence of images at 5-micron steps are obtained and stored, along with their Z values:

1. I=0
2. FROM Z = CURRENT_Z − 100 $\mu$m TO CURRENT_Z + 100 $\mu$m STEP 5 $\mu$m
3.   MOVE_OBJECTIVE_TO(Z)
4.   IMAGE[I] = AQUIRE_CURRENT_IMAGE
5.   IMAGE_Z[I] = Z
6.   I=I+1
7. NEXT Z

Figure 3:
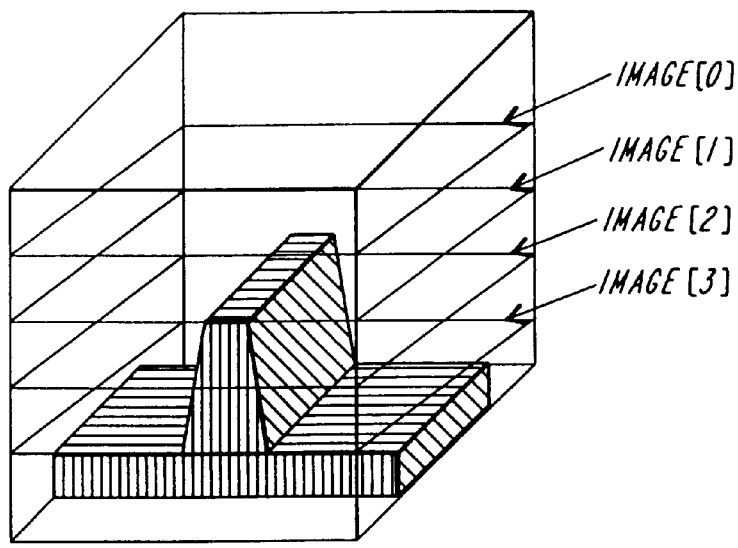
FIG. 3 shows the reconstruction of a three-dimensional topography from multiple two-dimensional images.

This procedure is shown schematically in FIG. 3, where images 0 through 3 are collected using the computer instructions above.

The stored images are then transformed by a gradient operator that has large values wherever the image has sharp intensity transitions:

1. FOR I=0 TO MAXIMUM_I
2.   GRADIENT[I] = GRADIENT_OPERATOR( IMAGE[I] )
3. NEXT I

Figure 4:
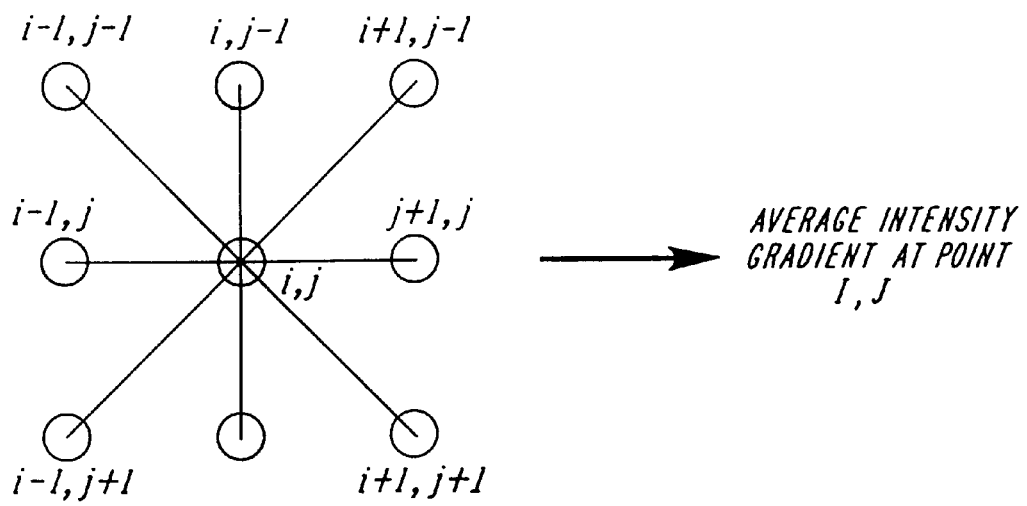
FIG. 4 shows the gradient-based calculation algorithm used to determine the intensity gradient.

FIG. 4 illustrates this next step. The output is the average intensity gradient at point I,J.

The height map and the intensity map are then calculated as follows:

1. FOR X = 0 TO MAX_X
2. FOR Y = 0 TO MAX_Y
3.   I = FIND_IMAGE_WITH_LARGEST_GRADIENT_AT( X, Y )
4.   HEIGHT_MAP[X,Y]=IMAGE_Z[I]
5.   INTENSITY_MAP[X,Y]=IMAGE[I] [X] [Y]
6. NEXT Y
7. NEXT X

FIG. 5 illustrates the height map and intensity map calculations using this program.

After these calculations have been performed, HEIGHT_MAP contains the Z-height at every X,Y point of the image and INTENSITY_MAP contains the image intensity at every point, when the particular location is in focus. These maps are then used to modulate the laser power and scanning speed as an operation is performed. The typical scan-speed modulation condition is shown in FIG. 6($a$) where a calculated adjustment in scan speed is made to compensate for changes in the angle of inclination of the substrate structure. FIG. 6($b$) indicates a further laser process correction that is made to compensate for the reflectivity change that may accompany the laser deposition process itself. For example, the surface reflectivity may increase significantly when metals are deposited. This forms a mirror that reduces laser absorption by the substrate. Therefore, the laser power is increased during deposition to keep a constant heating condition. The focal point trajectory is calculated using the HEIGHT_MAP obtained through the calculations outlined previously.

Figure 7:
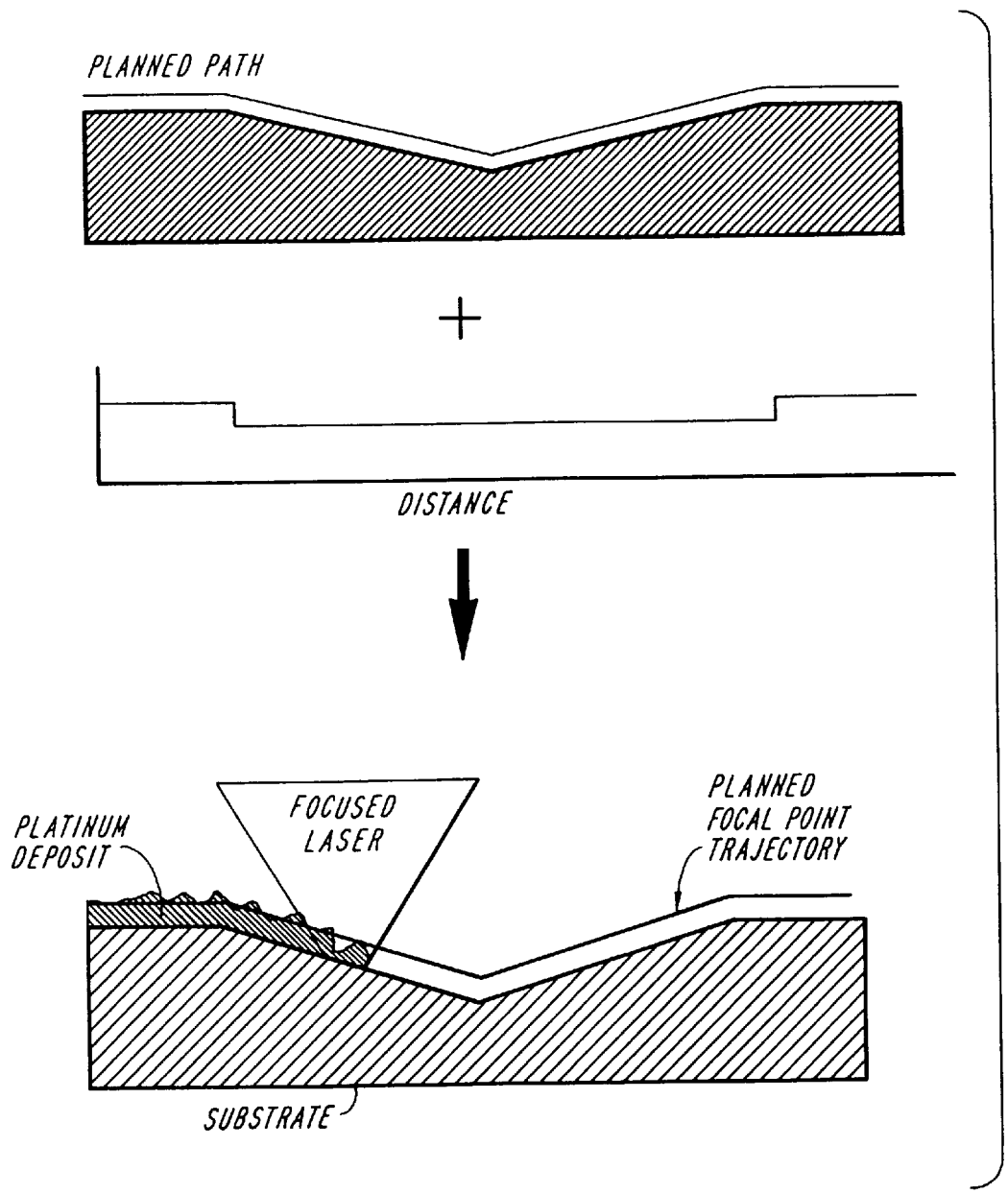
FIG. 7 (top) shows a side-view profile of automatically calculated three-dimensional path over topography (V-groove) along with the corresponding automatically calculated scan-speed modulation, and (bottom) laser direct-writing deposition utilizing the calculated path;.

Because ramp-like variations in Z (substrate height) effectively increase the laser X,Y speed relative to the substrate, a speed compensation is needed. The goal is to keep the velocity tangent to the path constant. FIG. 7 illustrates the combination of a planned-path laser trajectory with a speed-distance map to create an optimal scanning pattern on a V-groove substrate.

In a further example of an image-based compensation, a calorimetric thickness measurement can be used to control laser intensity. A typical problem is the determination of substrate thickness remaining during the laser microchemical thinning of a semiconductor wafer. It is frequently desirable to decrease the laser intensity as the wafer is thinned since the temperature of the laser zone tends to increase excessively with reduced conduction when the wafer becomes thin. For this example, it is important to reference the remaining thickness to the underside of the wafer because variations between wafers make uncertain an absolute a priori knowledge of initial wafer thickness.

Using the invention, the remaining substrate thickness is periodically measured by measuring the ratio of reflected light at two wavelengths with different attenuations in the substrate. For example, with silicon substrates yellow wavelengths are much more strongly absorbed than red wavelengths. By monitoring the ratio of yellow reflected light to for example, red reflected light, it is possible to track the thickness of the silicon wafer as it is thinned.

The return signal from the underside of the silicon wafer can be maximized by choosing an aluminized region of the underside surface. The process is optimized to measure greater wafer thickness by choosing two wavelengths in the near infrared region on the spectrum (e.g., 800 nm to 1500 nm wavelength). The invention provides for mapping non-uniform thickness remaining across the full wafer image.

In addition, attenuation of wavelengths near the bandgap are strongly dependent on (temperature-dependent) free carrier concentrations. Accordingly, image-based compensation can be used for temperature mapping of semiconductor substrates during laser processing. For temperature mapping, reflected light intensity near the band gap is measured across the wafer and correlated with input laser intensity and dwell. Local heating of the wafer greatly reduces the reflected light signal and therefore, temperature can be known with high spatial resolution. Reflected light can be compared across the wafer or for a better absolute temperature determination, can be measured as a ratio of near-band-gap and sub-band-gap (longer wavelength) colors. For measurements on silicon image-based temperature mapping, a wavelength near 1.2 $\mu$m wavelength. A good reference choice for ratio calibration is a wavelength between 1.7 and 3 $\mu$m.

The following non-limiting examples are presented.

EXAMPLE 1

A frequency-doubled Nd:YLF laser operating at 525 nm was used in the experiments. This was operated in a Q-switched mode at a repetition rate of 0.1 to 50 kHz and a pulse length of 7 to 30 ns. To demonstrate the "regenerative switching" aspect of the invention, a custom laser pulsing circuit was developed to operate the laser above its designed pulse repetition rate. This pulser was directly interfaced to an electronic timer regulated by a personal computer. The pulse energy was varied from 5 $\mu$J/cm$^2$ to 100 mJ/cm$^2$ at the substrate. Various microscope objective lenses with numerical apertures of 0.1 to 0.5 were used for the focusing optics. Because of the need to inject the light through the window of the substrate fixture 9, microscope objectives with optical correction for use with a cover glass are preferred. The application of a visible laser permits the use of standard refractive lenses with no special chromatic correction. When applied with a UV or IR laser, it is preferred to use reflective optics or those with special chromatic correction. In our experiments, a crossed roller bearing X, Y stage was used with linear motor drives and glass scale encoders. These permitted 0.15 $\mu$m resolution in the X,Y position. For the Z-direction, a crossed roller bearing stage with rotary DC motor and a glass scale encoder was used, resulting in 0.12 $\mu$m resolution in z positioning. The three axes (X,Y,Z) were all closed-loop servo controlled.

Employing the apparatus in FIG. 1, laser deposition was performed over silicon V-groove substrates. The substrates were prepared by anisotropic wet etching of silicon <100> oriented substrates in potassium hydroxide solution. This etch creates V-grooves of 100 $\mu$m to 200 $\mu$m in depth, defined by the intersection of (100) lattice planes. Laser writing was with a diode-pumped, frequency-doubled Nd:YLF laser operating at 525 nm wavelength (SpectraPhysics Corporation). A long-working-distance, 50× microscope objective (Mitutoyo Corporation) was used as the focusing lens. The X, Y positioner was a 6-inch travel linear-motor-driven stage with linear encoders for servo feedback (Anorad Corporation). The Z-axis servo was a DC rotary motor actuator (Newport Corporation) combined with a glass scale encoder (Heidenheim Corporation). The beam conditioning optics comprised various lenses, mirrors and a telescope beam expander. The Image Processor included a color CCD camera (Panasonic Corporation), a motorized zoom lens (DO Industries) and frame-grabbing electronics (Mattrox Corporation). The Path Generator computed the optimum trajectory with electronics and software housed inside a 486-based personal computer. The motion controller was based around a 4-axis smart servo-control electronics (Delta Tau Corporation) with additional software.

The substrate fixture 9 was a stainless steel vacuum cell, approximately 9×9×1 inch, with a 3.5 mm-thick quartz window to permit injection of the laser beam. This was designed to implement laser CVD from vapor precursors and laser assisted etching. Well-known modifications (see D. J. Ehrlich et al., "Laser Microchemistry for use in Solid State Electronics", IEEE J. Quantum Electronics QE-16 p. 1233, 1980) permit the alternative laser direct write deposition from liquid sources and solid-state thin film sources. The vacuum cell was connected to a mechanical vacuum pump capable of approximately 50 m Torr pressure. The precursor gas, platinum tetrafluorophosphine (Pt(PF$_3$)$_4$), was backfilled into the cell to a pressure of 0.1 to 30 Torr, with the purpose of depositing platinum films. Substrates used were silicon dioxide, silicon, and polyimide although comparable results would be obtained on many materials. For deposition, the laser was focused onto the substrate and the beam was translated at a rate of 0.01 to 500 $\mu$m per second to achieve deposition of platinum films in the thickness range of 0.05 to 15 $\mu$m thick. The films were highly conducting with electronic resistivities typically within a factor of 2 to 4 of the known bulk platinum resistivity. The mechanism of deposition was a thermally activated pyrolytic reaction.

The V-Groove substrates were placed in a windowed stainless steel vacuum cell evacuated by means of a mechanical roughing pump (Leybold Corporation). The cell was backfilled with 1 Torr of platinum tetrafluorophosphine vapor. The scan speed and laser power required for optimum deposition at various tilt angles were then calibrated by trial and error. Typical scan speeds were 1 to 10 $\mu$m per second. Powers were 0.5 to 20 microjoules per pulse at a pulse repetition rate of 10 to 50 kilohertz. This data was used to create an "inclination speed" map. The image-based positioner was then used to plan the three-dimensional path, speed versus distance and power versus distance plots for the laser scan. The laser scan was then executed with the resulting laser exposure creating the platinum line by thermal decomposition of the platinum fluorophosphine vapor.

Figure 8:
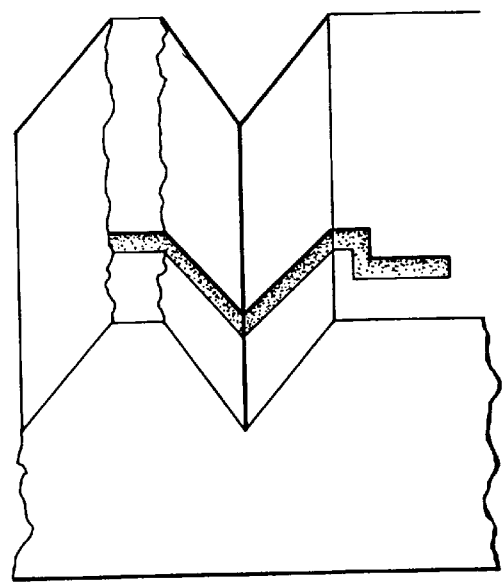
FIG. 8 shows schematically the actual implementation of the invention to laser deposit a platinum line into a deep V-groove on a silicon substrate;.

FIG. 8 shows schematically the result of a platinum line deposited into a V-groove substrate as revealed by scanning electron microscopy. Note that the line closely follows the contours of the V-groove. For reference, the depth of focus of the focusing optic is less than 2 $\mu$m although the depth of the contour exceeds 100 $\mu$m.

Figure 9A:
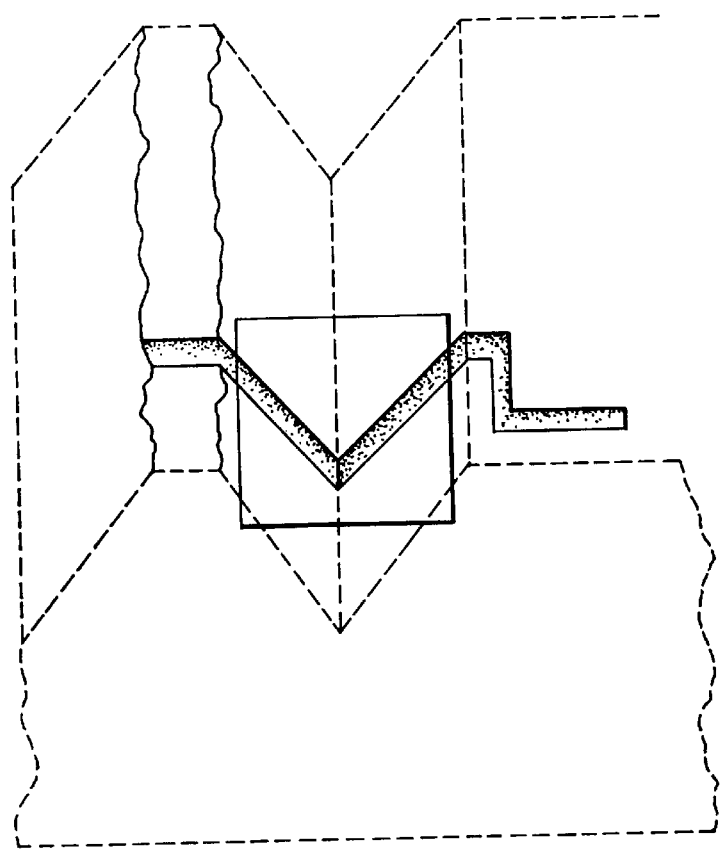
FIG. 9(a) shows schematically the laser deposition of platinum using the planned path feature of the image-based positioner invention.
Figure 9:
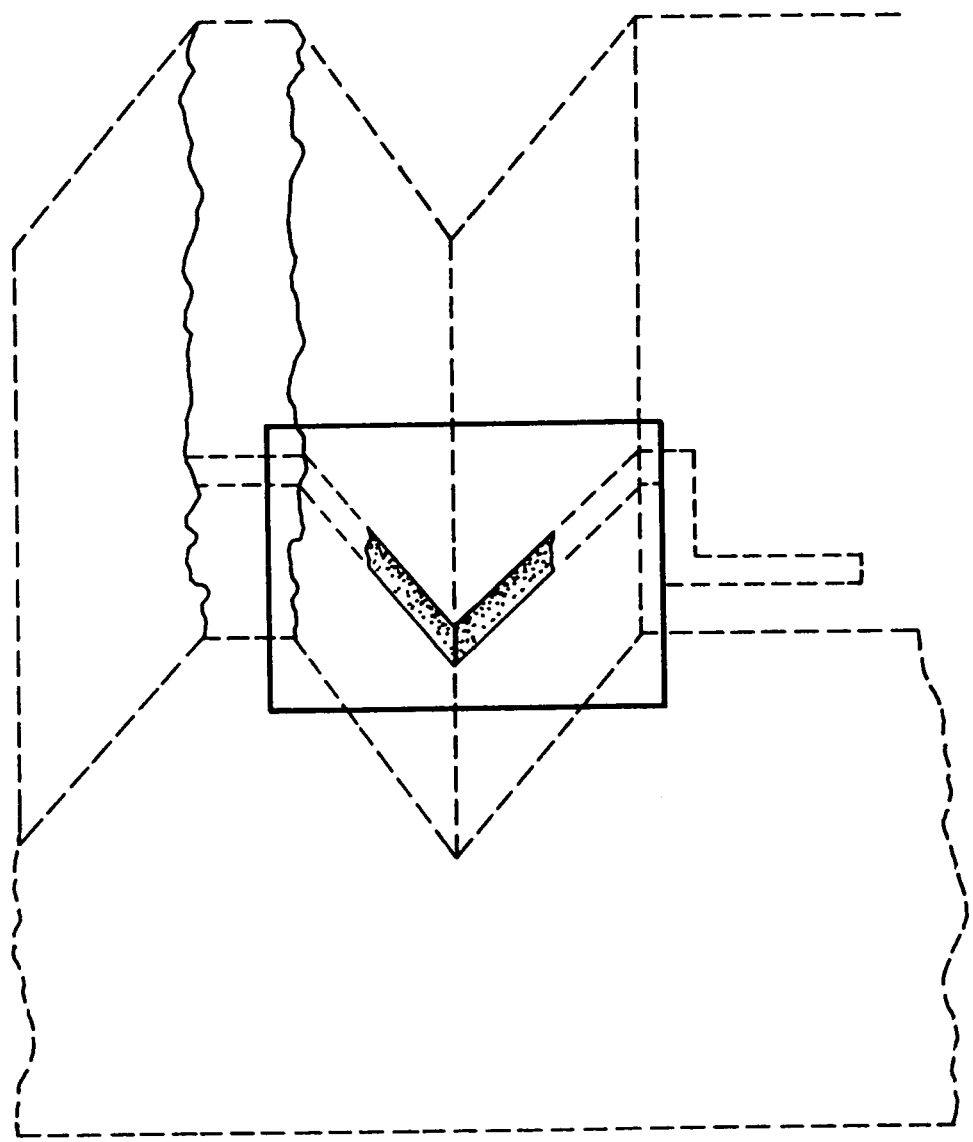
FIG. 9(b) shows schematically laser writing using prior art techniques.

FIG. 9(a) shows schematically a similar line, again demonstrating the usefulness of the invention in laser writing over three-dimensional substrates. To illustrate this further, the image-based path-planning algorithm was turned off while all laser parameters were maintained as before. FIG. 9(b) shows schematically the resulting platinum deposit, which is restricted to only the very bottom of the V-groove where the laser can maintain focus. Contouring over deep topography, without the invention, was not possible.

Figure 10:
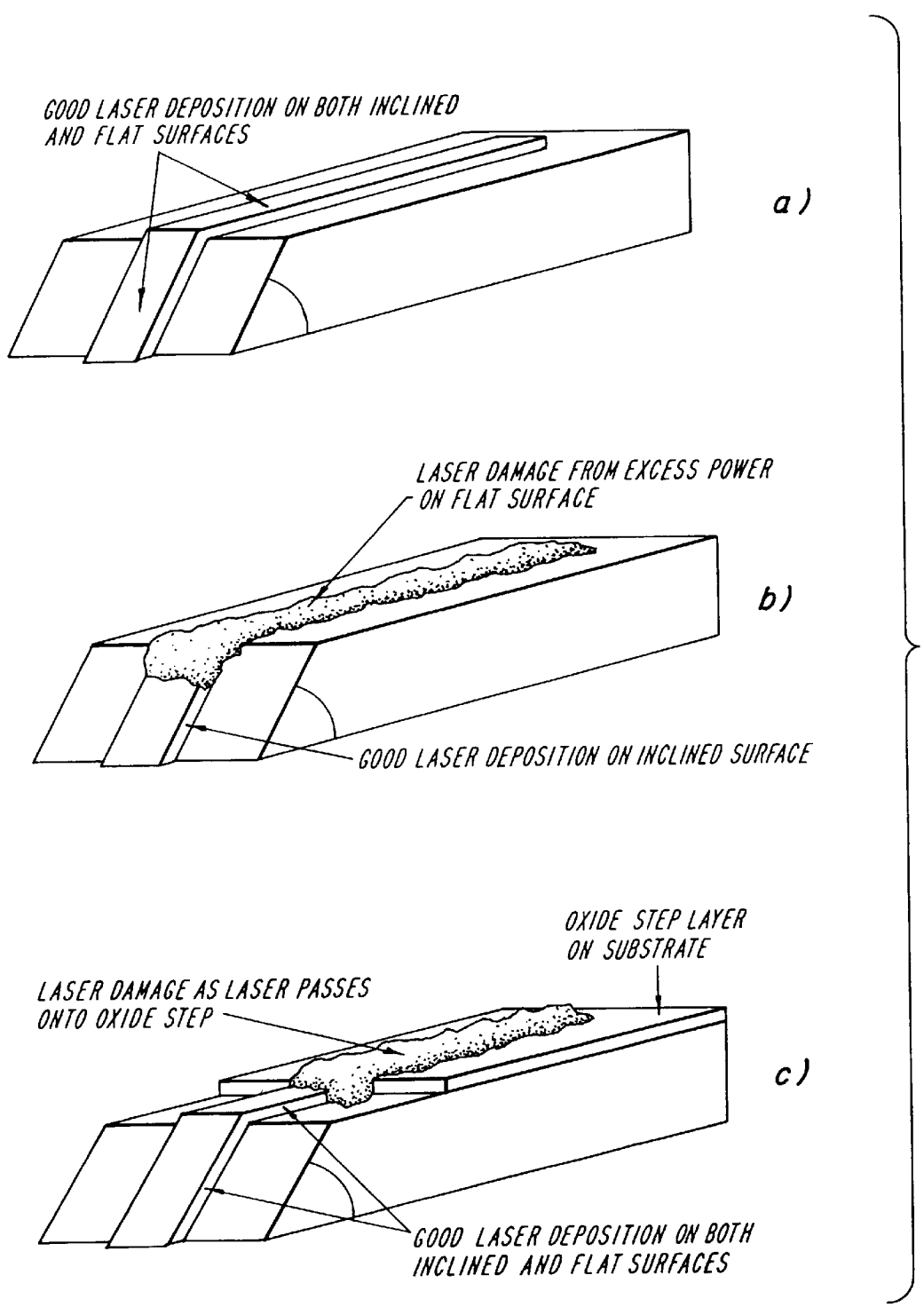
FIG. 10(a) shows schematically laser writing of platinum in accordance with the invention.
FIG. 10(b) shows schematically laser writing over the same topography as FIG. 10(a) using prior art techniques.
FIG. 10(c) shows schematically laser writing using prior art techniques to write over an oxide step on a silicon wafer.

FIGS. 10(a) and 10(b) show the result realized at the point of a large discontinuity in substrate slope, i.e., at a point where the laser writing moves out of a V-groove onto a flat portion of the substrate surface. This corresponds to a change from approximately a 57-degree laser angle of incidence to approximately a 90-degree laser angle of incidence. The power-adjustment feature of the invention adjusts for the difference in angle and results in a continuous line over the slope change. The substrate was extensively damaged without power compensation. When the laser power was turned down to a constant value that did not damage the normal incidence substrate, writing could not be achieved in the V-groove region. FIG. 10(c) illustrates that a similar compensation is required for writing between two areas on a surface with different materials. In this case, an oxide step over a portion of the substrate operates as an antireflection layer and increases the laser absorption under the (transparent) oxide step. Without use of the invention to compensate the laser power, the result is laser damage as the laser writes up onto the oxide. This experiment demonstrates the usefulness of the power versus distance feature of the invention.

EXAMPLE 2

A series of experiments were performed in laser writing continuous platinum lines over topographically complex polymer/metal substrates. The surfaces of these consisted of 10 $\mu$m-thick, patterned copper lines, over 25 $\mu$m-thick polyimide films. The apparatus of FIG. 1 was used with a continuous wave argon ion laser operating at 488 nm and 514 nm wavelength as the source. A 0.5 numerical aperture microscope objective lens, producing a depth of focus less than 2 $\mu$m was used for focusing the laser light. Platinum tetrafluorophosphine gas at a pressure of 1 Torr was used as the precursor gas.

The greatest difficulty in writing over these polyimide/ copper substrates is the three-order-of-magnitude (or larger)

difference in thermal conductivity between the copper and polyimide. Therefore there is a large difference in laser power required. Continuous lines could be written with the invention by using an algorithm which strongly increases the laser power at the junction where lines are written from polyimide areas onto copper.

To confirm control through "regenerative switching" the writing process was switched repetitively between deposition and etching modes. Platinum deposition was achieved on a (100)-oriented silicon wafer at 2 Watts pump power and 90,000 Hz repetition rate. Cutting of silicon nitride passivation on the same substrate was at 0–0.43 Watts pump power and 500 Hz repetition frequency. Note that the laser pump power is actually turned down to effect the cutting operation.

The previous examples describe applications of laser microchemical deposition in which a laser is focused to micrometer dimensions and is used to decompose an organometallic vapor, thereby inducing local-area deposition. An alternative application is laser microchemical etching. The latter is accomplished in methods well-known to practitioners of the laser processing art by replacing the organometallic vapor with an etchant vapor to thereby induce local-area etching. A suitable etching vapor contains a halogen, such as chlorine. Laser heating of the substrate then generates a thermally-activated etching microreaction in which the irradiated region is consumed by the etchant vapor. The reaction forms volatile halides which are removed by pumping them away from the substrate. All substantive features of the present invention are equally applicable to this alternative form of laser direct write microchemistry.

EXAMPLE 3

The procedure of Example 1 was followed with the following modifications to obtain a laser-etched silicon substrate. An argon ion laser operating at a 514.5 nm wavelength and a power level of 2 $\mu$joules/cm$^2$ was used to obtain a laser power density at the substrate of 1.5 W/cm$^2$. The precursor gas was backfilled into the vapor cell at a pressure of 200 Torr to etch the silicon substrate. To induce etching, the laser was focused through a 5 $\mu$m diameter aperture. The resultant etch rate obtained was 100,000 $\mu$m$^3$/sec on the silicon substrate.

It will thus be seen that the invention efficiently attains the objects set forth above, among those made apparent fro the preceding description. It will be understood that changes may be made in the above construction and in the foregoing sequences of operation without departing form the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A method for controlling a chemical vapor deposition process on a substrate having a surface characterized by a three dimensional topography, the method comprising,
generating preset values for chemical vapor deposition process parameters including power, trajectory, and scan velocity of a laser beam for irradiating said substrate surface,
acquiring one or more planar images during said controlling of said chemical vapor deposition process at a series of focal planes on the substrate surface by measuring light reflected from said substrate surface at each of said focal planes, wherein each of said planar images is normal to a common z-axis passing normal through the substrate surface and each of said focal planes is at a different height along said common z-axis,
processing said planar images to determine measured topographical features of a segment of said substrate surface and generating a height map representative thereof, and
processing said measured topographical features of said height map with said preset values to generate an updated value for at least one of said power, said trajectory, and said scan velocity of said laser beam in real time during said controlling of said chemical vapor deposition process and causing said deposition there.

2. The method according to claim 1, further comprising controlling motion of at least one of said laser beam and said substrate to implement said trajectory at said scan velocity.

3. The method according to claim 1, wherein said measured topographical features include local tilt and step height.

4. A method for controlling a laser direct write process on a substrate surface having said surface characterized by a three dimensional topography, said method comprising,
measuring an actual thickness of said substrate at series of measurement points along a segment of said substrate by,
illuminating said substrate at said measurement points with a first light having a first wavelength,
illuminating said substrate at said measurement points with a second light having a second wavelength, wherein said first wavelength and said second wavelength are spaced sufficiently apart to avoid forming an interference pattern, and
determining a ratio between a first intensity of a first reflected light reflected from said measurement points at said first wavelength, and a second intensity of a second light reflected from said measurement points at said second wavelength,
generating a substrate thickness map of said segment of said substrate by correlating said measured substrate thickness with each of said measurement points, and
selecting at least one of power, trajectory, and scan velocity of a laser beam for irradiating said segment of said substrate surface during said controlling of said laser direct write process in response to said thickness of the segment of said substrate as indicated by said substrate thickness map and causing said laser direct write therewith.

5. The method according to claim 4, further comprising, updating said substrate thickness map with additional information during said controlling of said laser direct write process by measuring additional actual thicknesses of said substrate at other measurement points different from said series of said measurement points, and correlating said additional actual thicknesses with said other measurement points.

6. The method according to claim 5, further comprising, altering at least one of said power, said trajectory, and said scan velocity of said laser beam in real time in response to said updating of said substrate thickness map.

7. A method for controlling a a chemical vapor deposition process on a substrate, said method comprising, acquiring one or more planar images during said controlling of said chemical vapor deposition process at a series of measurement points on a surface of said substrate by measuring light reflected from said surface of said substrate at each of said measurement points, wherein each of said planar images is normal to a common z-axis passing normal through the substrate surface, processing said planar images to identify any of a plurality of materials on a segment of said surface of said substrate, and generating a coded map representing identified ones of said plurality of materials present on said segment of said surface of said substrate, and selecting at least one of power, trajectory, and scan velocity of a laser beam for irradiating said segment of said substrate during said controlling of said chemical vapor deposition process in response to said identified ones of said plurality of said materials, as indicated by said coded map and causing said deposition therewith.

8. The method according to claim 7 further comprising, exposing said segment of said surface of said substrate to substantially white light during said controlling of said chemical vapor deposition process, generating a first color map representative of a first spectral reflectivity of a first light reflected from a first material on said segment of said surface of said substrate in response to said substantially white light, and generating a second color map representative of a second spectral reflectivity of a second light reflected from a second material on said segment of said surface of said substrate in response to said substantially white light.

9. The method of claim 8, further comprising, identifying at least one of said first and said second materials present on said segment of said surface of said substrate based upon said first and second color maps.

10. A method for controlling a chemical vapor deposition process on a substrate having a surface characterized by a three dimensional topography, said method comprising, measuring temperature at a series of measurement points on a segment of said surface of said substrate by, illuminating each of said series of measurement points with a first light having a first wavelength, detecting a first reflected intensity value for each of said series of measurement points, wherein said first reflected intensity value represents an intensity of a reflected portion of said first light from an associated one of said series of measurement points, illuminating each of said series of measurement points with a second light having a second wavelength, wherein said first wavelength and said second wavelength are spaced sufficiently apart to avoid forming an interference pattern, detecting a second reflected intensity value for each of said series of measurement points, wherein said second reflected intensity value represents an intensity of a reflected portion of said second light from an associated one of said series of measurement points, and determining a ratio between said first reflected intensity value and said second reflected intensity value for each of said series of measurement points, generating a temperature map of said segment of said surface of said substrate by corresponding said ratio at each of said series of measurement points with a measured temperature, and wherein said temperature map identifies said measured temperature at each of said series of measurement points, and selecting at least one of power, trajectory, and scan velocity of a laser beam for irradiating said segment of said surface of said substrate during said controlling of said chemical vapor deposition process in response to said measured temperature as indicated by the temperature map and causing said deposition therewith.

* * * * *